United States Patent
Chabinyc et al.

(10) Patent No.: US 6,759,713 B2
(45) Date of Patent: Jul. 6, 2004

(54) ELECTRONIC DEVICE STRUCTURES INCLUDING INTERCONNECTING MICROFLUIDIC CHANNELS

(75) Inventors: Michael L. Chabinyc, Mountain View, CA (US); William S. Wong, San Carlos, CA (US); Kateri E. Paul, Mountain View, CA (US); Robert A. Street, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/303,524

(22) Filed: Nov. 22, 2002

(65) Prior Publication Data

US 2004/0099911 A1 May 27, 2004

(51) Int. Cl.[7] .............................................. H01L 27/01
(52) U.S. Cl. ....................... 257/347; 257/348; 257/350; 257/351
(58) Field of Search .................... 204/600; 257/347–350

(56) References Cited

U.S. PATENT DOCUMENTS 6,267,858 B1 * 7/2001 Parce et al.
6,322,736 B1 11/2001 Bao et al. .................... 264/105

OTHER PUBLICATIONS

Drury, et al., "Low–cost All–polymer Integrated Circuits", *Applied Physics Letters*, Jul. 1998, vol. 73, No. 1, pp. 108–110.
Garnier et al., "All–polymer Field–effect Transistor Realized by Printing Techniques",*Science*, New Series, vol. 265, Issue 5179, Sep. 16, 1994, pp. 1684–1686.

* cited by examiner

*Primary Examiner*—Fetsum Abraham
(74) *Attorney, Agent, or Firm*—Kent Chen

(57) ABSTRACT

A structure and method of using microfluidic channels to form an array of semiconductor devices is described. The microfluidic channels have been found to be particularly useful when formed in a self aligned process and used to interconnect a series of thin film transistor (TFT) devices.

22 Claims, 6 Drawing Sheets

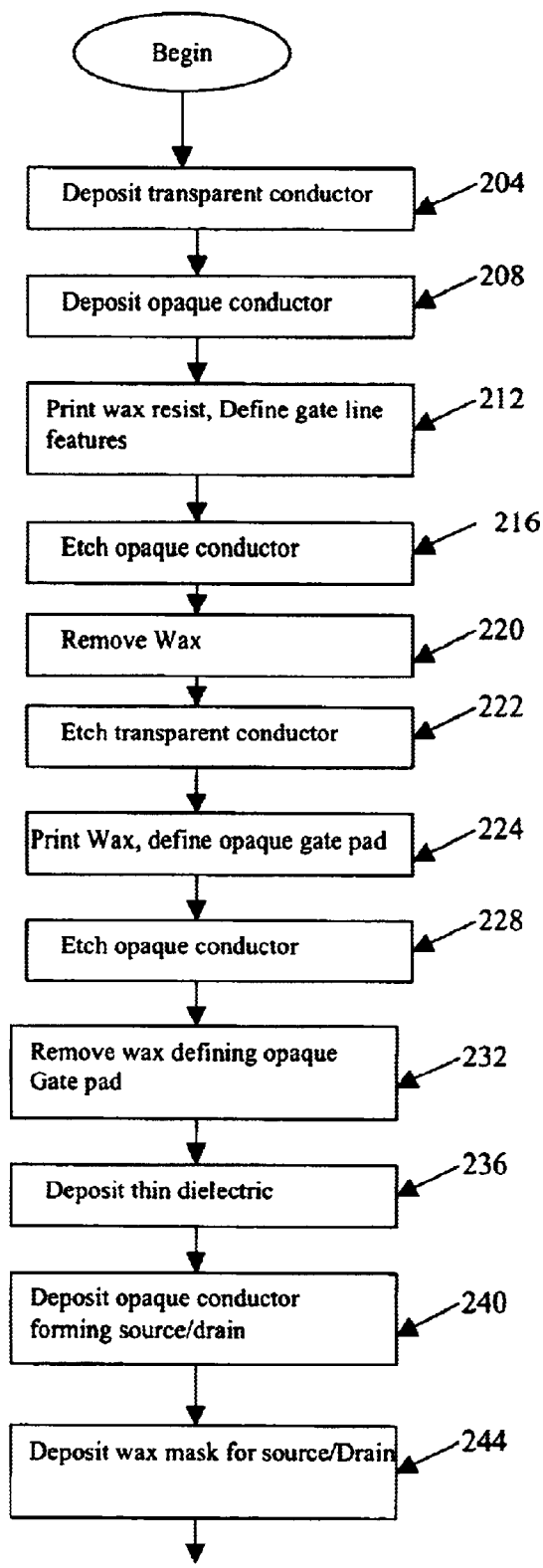
Continued    Fig 2.

ELECTRONIC DEVICE STRUCTURES INCLUDING INTERCONNECTING MICROFLUIDIC CHANNELS

RELATED APPLICATIONS

This application is related to application Ser. No. 10/303,551 entitled "Method of Fabrication of Electronic devices Using MicroFluidic Channels" assigned to the same assignee and also filed Nov. 22, 2002.

FIELD OF THE INVENTION

The invention relates to semiconductor processing, more particularly, the invention relates to the fabrication of large-area arrays of thin film transistors.

BACKGROUND

In recent years, large area thin-film transistor (TFT) arrays have found important applications in imaging devices and display devices. However, fabrication of arrays of TFTs is relatively expensive due in part to the cost and complexity of the photolithographically-based processing techniques used in the fabrication process.

Recently organic semiconductors have been used to form TFT arrays. Such organic semiconductors are preferred due to their compatibility with flexible substrates. Using organic semiconductors also reduces fabrication costs. One reason for the lower fabrication costs is that solution-processable organic semiconductors can be patterned using jet-printing, screen printing, or micromolding. Jet printing is described in U.S. Pat. No. 5,972,419 "Electroluminescent Display and Method for Making the Same", WO0146987A2 "Inkjet-Fabricated Integrated Circuits"; screen printing is described in "All-Polymer Field Effect Transistor Realized by Printing Techniques" F. Garnier, R. Hajlaoui, A. Yassar, P. Srivastava Science 265 1994 p1684–1686 and micromolding is described in U.S. Pat. No. 6,322,736 "Method for Fabricating Molded Microstructures on Substrates" which are all hereby incorporated by reference.

However jet printing, micromolding and screen printing-based fabrication processes are not without difficulties. Jet-printing of organic semiconductors is a serial process and is thus slow. Also, jet printing of organic semiconductors is difficult because such printing involves special printheads maintained in precise alignment with printed features for extended periods of time. In addition, the size of the printed features is controlled, in part, by the wettability of the jetted solution on the substrate. Wettablility can be difficult to precisely control.

Micromolding techniques also present difficulties. Molding techniques usually call for the mold, frequently formed from an elastomeric polymer, be brought into contact with a substrate over a large area. Good registration of the mold and substrate can be difficult to achieve. Often, elastomeric molds are incompatible with the organic solvents used to dissolve the organic semiconductors. Screen printing is faster than jet printing because screen printing provides a parallel method of depositing the organic semiconductor. However, screen printing is typically incapable of fabricating small features with dimensions less than 100 micrometers due to: spreading of the deposited liquid on the substrate, difficulties in fabricating screens with fine features, and difficulties in registration between the screen and previously patterned features.

Thus a method of patterning small feature sizes with a solution-based organic semiconductor in a rapid, highly parallel manner is needed.

BRIEF SUMMARY OF THE INVENTION

An improved method of semiconductor processing is described. In the method, a series of micro-channels are formed to interconnect a plurality of electronic devices being formed. A solution including a solution-processable semiconductor flows into the microfluidic channels and is allowed to dry. Thus, the microchannel distributes the solution and the residue remaining after the solvent evaporates forms a part of the electronic device being formed.

DETAILED DESCRIPTION

A system of forming a self-aligned microfluidic channel is described. The system is particularly well suited to fabricating fluidic channels that interconnect TFTs in an array of TFTs.

Figure 1:
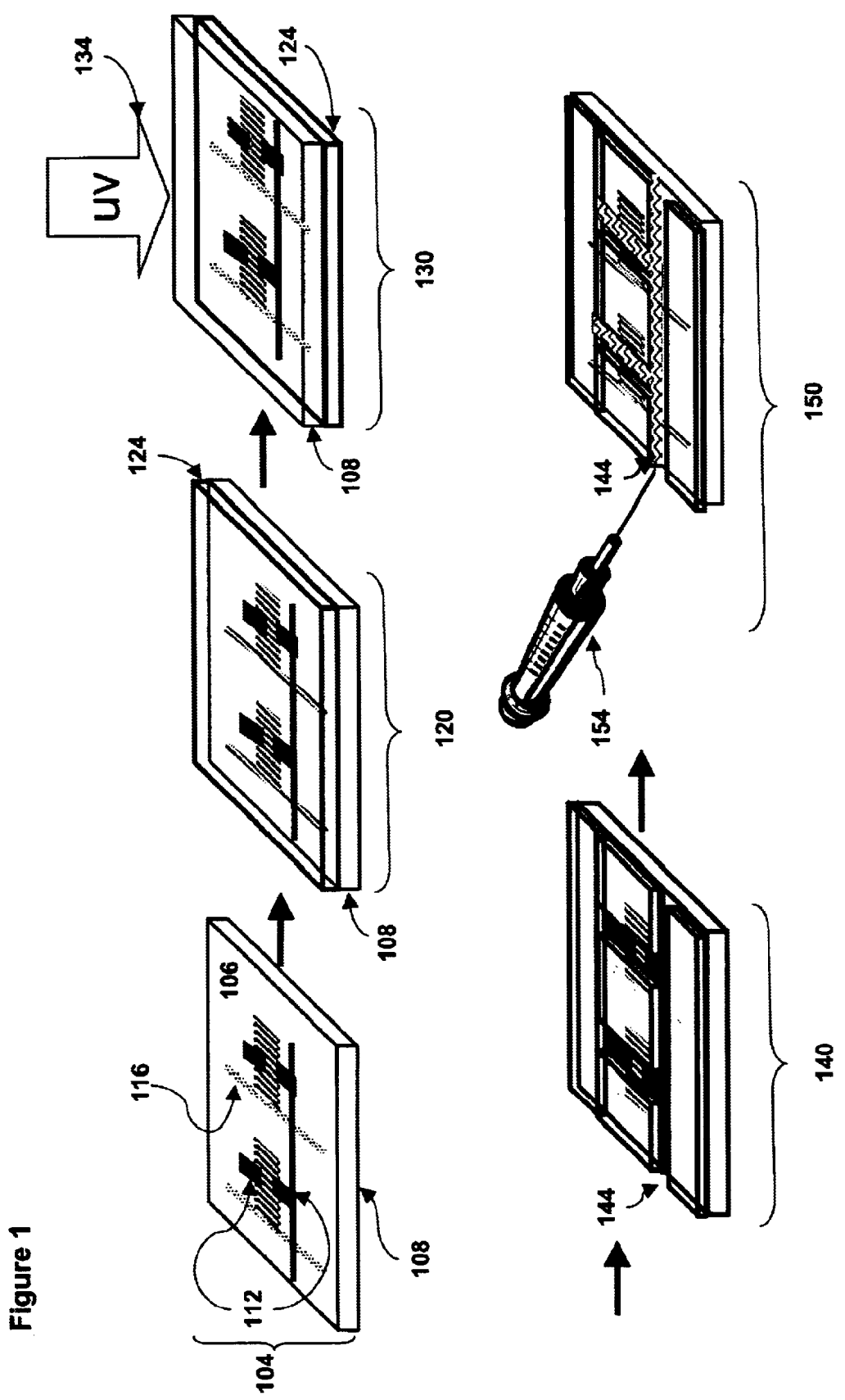
FIG. 1 shows a schematic of the process flow for fabricating self aligned microfluidic channels in one embodiment of the invention.

FIG. 1 provides a schematic of the process flow for fabrication of self-aligned microfluidic channels for TFTs. In section 104 of the process flow, a first surface 106 of transparent substrate 108 is patterned with an opaque pattern 112. The transparent substrate may be made from a variety of materials such as glass or plastic that passes most of the light in the ultraviolet or visible spectrum without significant attenuation; usually more than 50 percent of the light will pass through the substrate.

One method of simplifying the TFT fabrication process is to self-align the organic semiconductor used in TFT formation with the electrodes that will control the gate of the TFT and the electrodes that will control the source-drain voltage of the TFT. The conductive lines that form the data interconnects between the source regions of the TFTs can also be coated with the semiconductor without adversely affecting the performance of the TFTs. One method of accomplishing self-alignment is to fabricate the source, drain, and gate pad electrodes and data interconnect lines with an opaque conductor and subsequently to use the opaque conductor as a photomask. Thus, in one embodiment of the invention, at least a part of opaque pattern 112 is made from conducting lines, typically a metal such as gold or chrome. The metal forms the electrodes that control current flow in the source and drain regions, the gate pad that controls the gate voltage, and the interconnect lines connecting the source electrodes. The metal may be patterned using a variety of techniques, including but not limited to, wax-resist printing.

Not every conductor used in a TFT array is associated with a corresponding organic semiconductor region. Thus, in one embodiment of the invention, a second pattern of conductors 116 is formed using a transparent conductor, typically indium-tin oxide (ITO). The ITO forms the conducting parts of the TFT array control circuitry that are not associated with any organic semiconductor regions.

In section 120 of FIG. 1, a first surface 106 of transparent substrate 108 and an associated opaque and transparent pattern of conductors 112, 116 are coated with a polymer 124. The polymer is typically a photosensitive polymer such as SU-8, a commercially available type of optically curable epoxy, or other photosensitive material. The polymer may be coated on substrate 108 using a variety of techniques such as spin coating or dip coating In order to pattern the photosensitive material, section 130 of FIG. 1 shows light 134 passing through transparent substrate 108. Light passing through transparent substrate 108 develops exposed portions of the polymer. The light is typically UV or visible light having a wavelength between 200 and 600 nm. The light can define the photosensitive polymer by cross-linking functional groups in the polymer material or by creating functional groups that cross-link when heated. Thus, these processes change the physical properties of the polymer in the exposed region. Regions masked by the opaque conductor pattern 112 are not exposed to light of the particular frequency range and remain undeveloped. The undeveloped polymer is easily removed by stripping with a solvent.

Section 140 of FIG. 1 shows the resulting structure after the uncured polymer is removed. As illustrated, removal of the undeveloped polymer results in the formation of fluidic channels 144. The dimensions of each fluidic channel depend on the width of the original masking opaque conductor, the exposure characteristics of the photosensitive polymer, and the wavelength of light used in the curing process. The width of each fluidic channel may be smaller than can be formed using other techniques. Typically, each channel is significantly less than 500 micrometers in width, more usually less than 200 micrometers in width. When short wavelengths are used for photodevelopment, the width of the channel may be reduced to a size on the order of 0.5 micrometers.

Section 150 of FIG. 1 shows the deposition of a solution containing a semiconductor, typically a solution-processable organic semiconductor, into the channels. The solution-processable semiconductor is typically an organic polymer that is dissolved in a solvent that has a low viscosity, typically below 50 cP(measure of viscosity). Suspensions of colloidal or nanoparticulate inorganic semiconductors in solution form can also be used. Deposition of the solution-processable semiconductor may occur at one position in the microfluidic network. After deposition, the low viscosity allows the fluid containing the semiconductor to redistribute throughout the microfluidic network via natural capillary flow such that after a short amount of time, the fluid levels in the various interconnected microchannels are approximately equal. Deposition of the solution containing the semiconductor may be done using a variety of techniques, including micropipetting, piezo-based dispensing, and simple capillary action. In section 150, a syringe 154 and needle or micro-pipet structure is shown being used to deposit the solution containing the solution processable semiconductor.

After distributing the solution-processable semiconductor throughout the microchannels, the solution is allowed to dry in a low-particulate count environment to minimize the chances of contamination. In one embodiment, a heat source is used to control the drying process. The dried film or residue from the semiconductor solution produces a semiconductor layer of the TFT.

Figure 2:
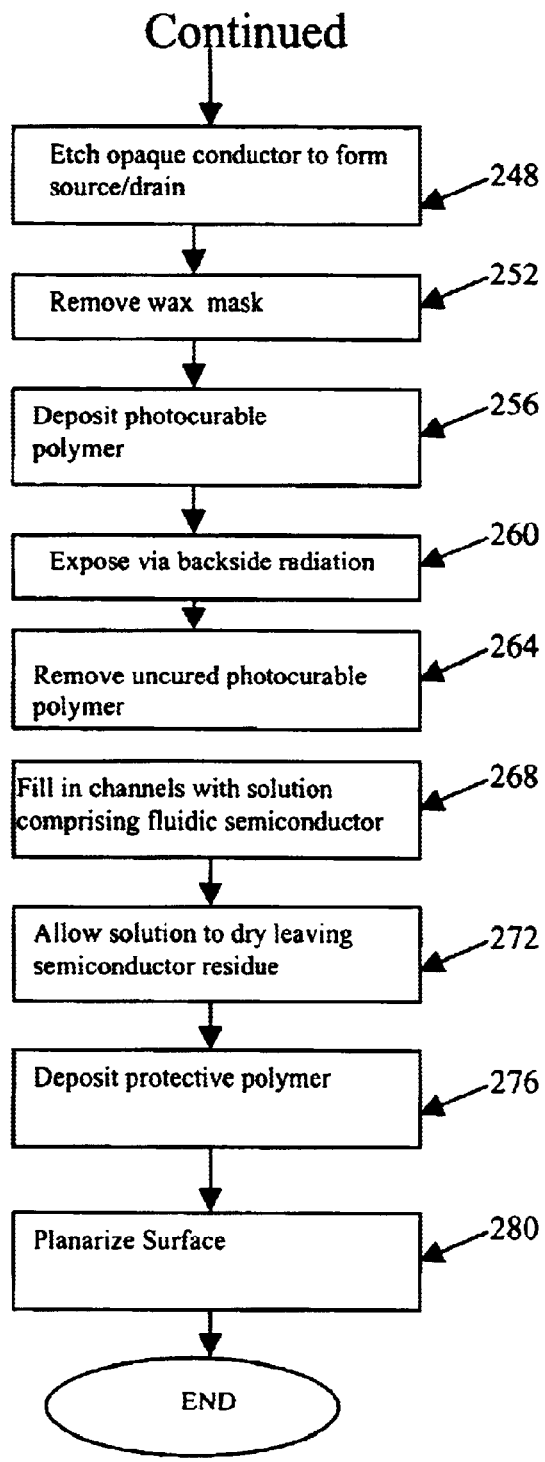
FIG. 2 is a flow chart that describes the process of forming a TFT using microfluidic channels.

The described process is particularly well suited for fabricating a TFT structure, although it may be used to form other structures. FIG. 2 provides a flow chart describing one method of using microfluidic channels to form a TFT array.

Figure 3:
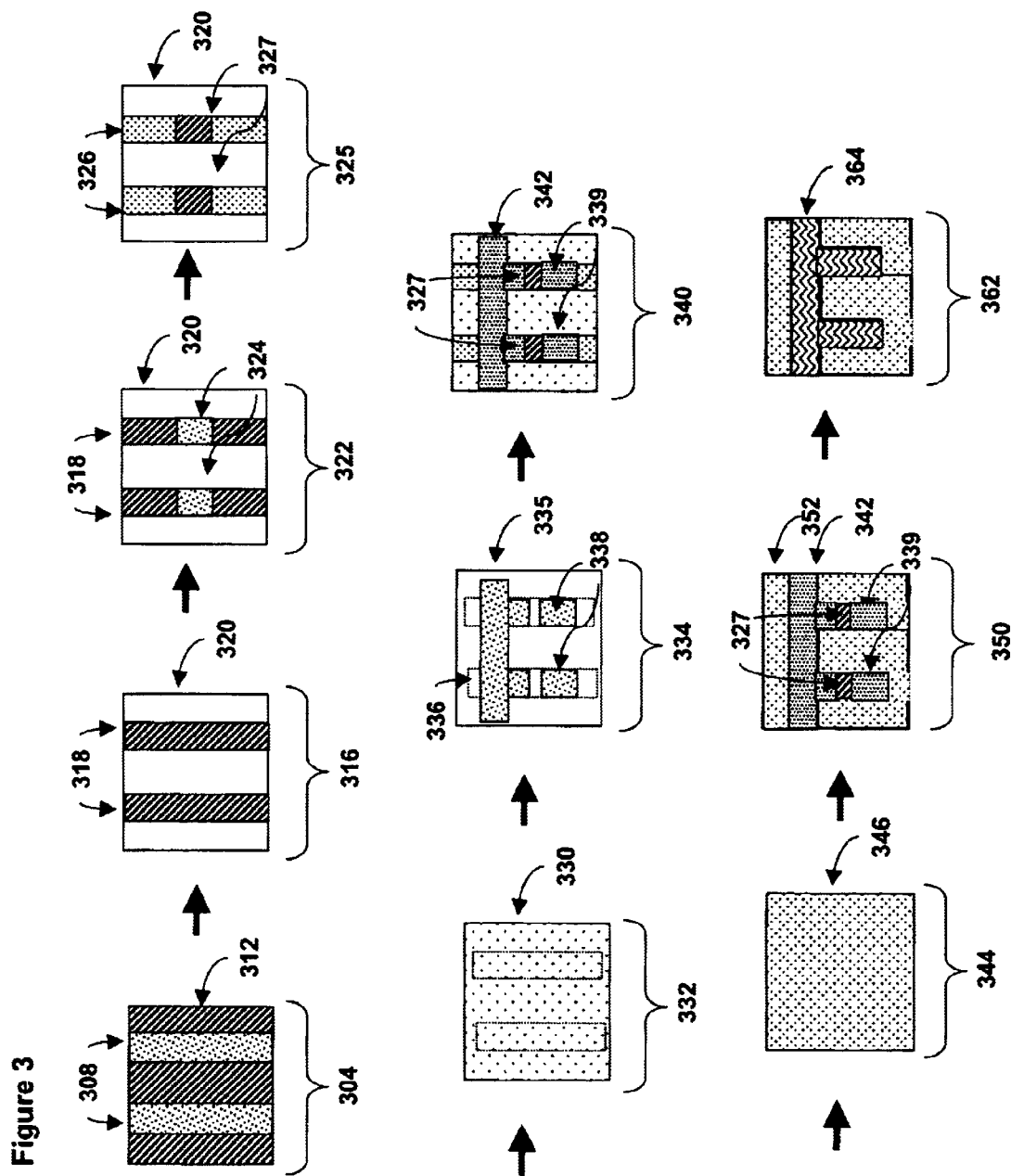
FIG. 3 is a top level view of a TFT being fabricated at various stages in the flow chart of FIG. 2.

FIG. 3 shows a top view of the TFT at various stages of the process described in FIG. 2.

In block 204 of FIG. 2, a transparent substrate is coated with a layer of a transparent conductor such as ITO. An opaque conductor, typically an opaque metal such as chrome is deposited over the transparent conductor in block 208. The opaque conductor and transparent conductors are subsequently patterned to create features that aid in the fabrication and also to control the operation of the TFTs.

A number of methods may be used to pattern the conductors. In one embodiment, the conductors are deposited via jet printing avoiding the need for subsequent patterning. In another embodiment, the printing is done using wax resists as described in blocks 212 and 216. In block 212, a wax resist is printed to define the opaque metal as a mask for the gate lines to couple a power source to the TFT. Structure 304 of FIG. 3 shows a printed wax region 308 defining the mask for the gate lines in opaque conductor 312. In block 216 of FIG. 2, the opaque conductor is etched. The wax acts as a mask resulting in a gate line made of an opaque conductor. The wax mask is removed in block 220. The transparent conductor is then etched in block 222. The etched opaque conductor acts as a etch mask for the transparent conductor. Structure 316 of FIG. 3 illustrates the resulting opaque conductor on transparent conductor region 318 on top of transparent substrate layer 320.

Next, the opaque gate pads are formed. Block 224 describes a printing of a wax mask that defines a gate pad. Structure 322 shows deposition of wax mask 324 over the line consisting of the opaque metal on the transparent conductor 320. The opaque conductor is etched in block 228. The wax mask protects the region under the mask such that removal of the wax mask in block 232 results in the opaque gate pad shown in structure 325. In structure 325, transparent conductor lines 326 couple chrome gate pads 327 to a controlling circuit (not shown). The procedure by which a wax is deposited, the conductor is etched, and the wax is removed is well known in the art. A detailed description is provided in U.S. patent application Ser. Nos. 09/838,684 and 09/838,685, both filed Apr. 14, 2001 which are hereby incorporated by reference.

Blocks 236 to 252 of FIG. 2 describe the formation of the source and drain of a TFT structure. In block 236, a thin dielectric film 330, such as a silicon dioxide or a polymer is deposited on a substrate as shown in structure 332. In block 240 of FIG. 2, a second opaque conductor layer is deposited on the substrate. The second opaque conductor layer is patterned to form the source and drain contacts and the data lines. In one patterning method, a wax mask is deposited in block 244. The wax mask protects regions of the conductor that will be used to form source pads, drain pads and data lines. Structure 334 of FIG. 3 shows the wax pattern on opaque conductor 335. The wax pattern masks data line 336 and source and drain pads 338. The conductor is etched in block 248 forming the data line and drain pads. In block 252, the wax is removed leaving structure 340. The resulting opaque conductor pattern forms source and drain contacts 339 as well as common data lines 342 connecting the TFTs in the TFT array.

Blocks 256 to 280 describe the formation of the semiconductor layer of the TFT. In block 256 a photosensitive polymer 346, typically SU-8 or other optically definable material, is deposited over the substrate as shown in structure 344. Deposition methods used to deposit the photosensitive polymer may include spin or dip coating. In block 260, a radiation source provides radiation that defines the unmasked regions of the photosensitive polymer. In one embodiment of the invention, the radiation exposure occurs through a backside of the substrate such that the opaque conductors between the substrate and the photosensitive polymer serve as a mask blocking the patterning radiation. When forming a TFT, using microchannels, the mask includes the gate pads, the source and drain and the data line regions.

In block 264, unexposed regions of the photosensitive polymer are removed using a solvent. Structure 350 of FIG. 3 shows the resulting structure where the exposed regions of polymer 352 define a network of openings. The network includes channels covering data lines 342 and covering the source-drain-gate pad regions 327, 339 of the TFTs in an array of TFTs. A solution of a TFT active material fills the network of openings in block 268. The solution is usually an organic semiconductor such as a poly(thiophene)-based polymer or poly(9-9'-dioctylfluorene-co-bithiophene). Other solution processable organic semiconductors such as thermally-curable, soluble precursors to pentacene may also be used.

The fluidic channels connect the series of openings and distribute the organic semiconductor throughout the circuit. The distribution system allows the fluid source to remain stationary and to deposit the fluid at one point of the channel. If faster filling speeds or large areas are required, the fluid source or a plurality of fluid sources could be moved to several positions along a microchannel. In the illustrated case, the number of distribution points for filling the microchannels is much smaller than the number of electronic devices or TFTs being formed along the microchannel, thus to at least one of the electronic devices, the microchannel is the primary source of semiconductor material.

Structure 362 of FIG. 3 shows the fluidic channels filled with organic semiconductor 364. Using microchannels to distribute semiconductor material allows the use of semiconductor materials that are difficult to jet print due to limited solubility or material incompatibilities with common printheads. The fluidic semiconductor is allowed to dry in block 272. The fluidic semiconductor typically includes a carrier solution and a semiconductor material disolved in the carrier solution. As the carrier solution evaporates, a residue remains and serves as semiconductor solid that forms part of the TFT.

In order to protect the semiconductor, a protective polymer such as poly(methylmethacrylate), poly(vinylalcohol), or poly(styrene) can be deposited into the fluidic channels in block 276. The protective polymer can be dissolved in a solvent and allowed to flow through the network of channels. The dried film encapsulates the semiconductor layer of block 272. Thus each channel includes a bottom portion filled with semiconductor and a top portion filled with a protective polymer. In block 280, the substrate is planarized.

Figure 4:
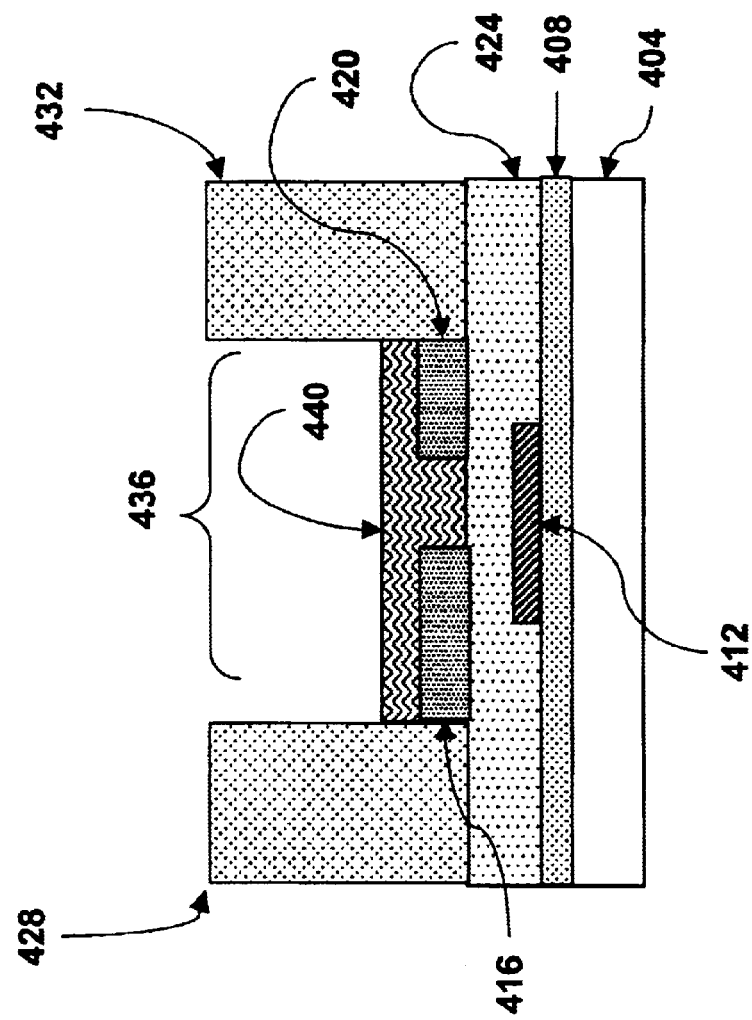
FIG. 4 shows a side cross sectional view of a microfluidic channel and the associated TFT.

FIG. 4 shows a cross sectional side view of an example TFT created using the methods of FIGS. 2 and 3. In FIG. 4, transparent substrate 404 supports a TFT structure. A conducting gate line 408 carries electrical signals to control a gate pad 412. The gate is separated from the source 416 and drain 420 by a thin dielectric layer 424 which prevents electrical shorting of gate 412 with source 416 and drain 420.

Channel walls 428, 432 define a channel 436. A portion of the channel cavity includes the region between source 416 and drain 420. A semiconductor material 440 which, at one point in time, was dissolved or suspended in a solvent carrier fills in the region between source 416 and drain 420. The channel walls confine the solvent and semiconductor material 440 until the solvent evaporates and the semiconductor material dries.

Figure 5:
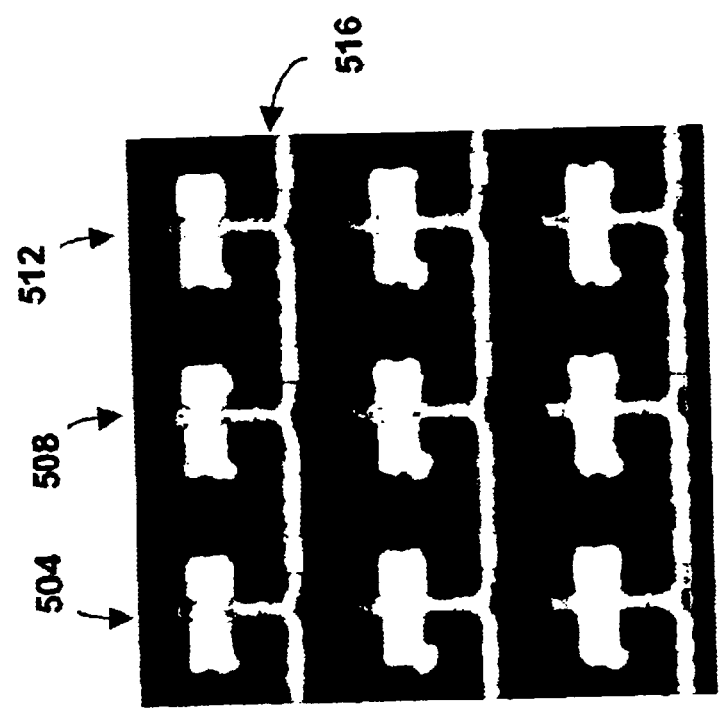
FIG. 5 shows a resulting TFT array fabricated using the process flows described in FIGS. 1 through 3.

FIG. 5 shows a top view of an array of TFTs coupled by microchannels that were used to distribute the solution-processable semiconductor. Each TFT semiconductor region 504, 508, 512, which includes the semiconductor over a source-gate-drain region, is coupled to other TFT semiconductor regions via corresponding microchannels 516. The microchannel was formed using the data line that addresses each source pad as a mask, in the example provided, usually two TFTs.

As used herein, a channel is defined as a region between two walls that is appropriate for confining a fluid, but allows a fluid to flow in a direction approximately parallel to a surface of the wall. The channel has a much longer length than width. When used in a circuit, the channel connects at least two circuit elements.

The preceding description has described in detail using microfluidic channels to distribute a solution-processable semiconductor to form arrays of semiconductor devices. In order to improve the readers understanding of the device, the detailed description includes a number of details such as the type of device (a TFT) being formed, and the type of fluidic semiconductor. Such details are included to facilitate understanding of the invention and should not be interpreted to restrict the scope of the invention. For example, instead of TFTs, the preceding description may be used to form other semiconductor devices such as light emitting diodes. Thus, the scope of the invention should only be limited by the claims set forth below.

What is claimed is:

1. A structure for forming a plurality of electronic devices comprising:
   a substrate;
   a plurality of electronic device regions, each device region including at least one electrical contact coupled to a corresponding electronic device on said substrate; and,
   a microchannel to distribute a solution including a material used to form a portion of the corresponding electronic device.

2. The structure of claim 1 wherein the microchannel has a width of less than 500 microns.

3. The structure of claim 1 wherein each electronic device in the plurality of electronic devices is a thin film transistor.

4. The structure of claim 3 wherein the microchannel follows a pattern, the pattern matching a conducting line coupled to a source contact of each thin film transistor.

5. The structure of claim 3 wherein the microchannel follows a pattern, the pattern matching a conducting line coupled to a drain contact of each thin film transistor.

6. The structure of claim 1 wherein each electronic device in the plurality of electronic devices is a light emitting diode.

7. The structure of claim 1 wherein the solution includes a polymeric organic semiconductor.

8. The structure of claim 1 wherein the solution includes an organic molecular semiconductor.

9. The structure of claim 1 wherein the solution includes a precursor to an organic semiconductor.

10. The structure of claim 1 wherein the solution includes a colloidal suspension of an inorganic semiconductor.

11. The structure of claim 1 wherein the solution includes a colloidal suspension of a metal.

12. The structure of claim 1 wherein the microchannel follows a pattern, the pattern matching a conducting line coupled to a gate contact of each thin film transistor.

13. The structure of claim 1 wherein the walls of the microchannel are formed from a photosensitive polymer.

14. The structure of claim 1 wherein said substrate is transparent.

15. The structure of claim 14 wherein the walls of each microchannel are formed from a photosensitive polymer.

16. The structure of claim 14 wherein an opaque conducting line coupled to at least one electrical contact is used to mask a portion of a photosensitive polymer, the masked portion of the photosensitive polymer to form the micro channel.

17. A structure for forming an array of thin film transistors comprising:

a plurality of thin film transistor, each thin film transistor including at least one electrical contact; and, a microchannel used to distribute a fluidic solution including a semiconductor used in the fabrication of each thin film transistor to each electrical contact.

18. The structure of claim 17 further comprising:

a transparent substrate to support the thin film transistor.

19. The structure of claim 18 further comprising:

a data line coupled to the electrical contact of each thin film transistor in the plurality of thin film transistors, the line used as a photomask to form the microchannel through a photosensitive polymer.

20. The structure of claim 19 wherein the electrical contact is a gate of each thin film transistor.

21. The structure of claim 19 wherein the electrical contact is a source of each thin film transistor.

22. The structure of claim 19 wherein the electrical contact is a drain of each thin film transistor.

* * * * *

UNITED STATES PATENT AND TRADEMARK OFFICE
CERTIFICATE OF CORRECTION

PATENT NO. : 6,759,713 B2 Page 1 of 1
APPLICATION NO. : 10/303524
DATED : July 6, 2004
INVENTOR(S) : Michael L. Chabinyc et al.

It is certified that error appears in the above-identified patent and that said Letters Patent is hereby corrected as shown below:

Column 1, line 11, insert as a new paragraph:

This invention was made with Government support under 70NANB0H3033 awarded by NIST/ATP. The Government has certain rights in this invention.

Signed and Sealed this

First Day of May, 2007

JON W. DUDAS
*Director of the United States Patent and Trademark Office*